(12) United States Patent
Ho

(10) Patent No.: US 8,164,843 B2
(45) Date of Patent: Apr. 24, 2012

(54) LENS MODULE WITH PROTRUSIONS ON OUTER SURFACE OF BARREL AND CAMERA MODULE HAVING SAME

(75) Inventor: Hung-Lung Ho, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 330 days.

(21) Appl. No.: 12/608,150

(22) Filed: Oct. 29, 2009

(65) Prior Publication Data

US 2010/0271718 A1    Oct. 28, 2010

(30) Foreign Application Priority Data

Apr. 27, 2009   (CN) .......................... 2009 1 0301878

(51) Int. Cl.
*G02B 7/02* (2006.01)

(52) U.S. Cl. ....................................................... 359/829

(58) Field of Classification Search .................. 359/704, 359/829

See application file for complete search history.

(56) References Cited

U.S. PATENT DOCUMENTS 7,367,724 B2 *   5/2008   Matsushita et al. ........... 396/529

* cited by examiner

*Primary Examiner* — Joseph P Martinez
(74) *Attorney, Agent, or Firm* — Altis Law Group, Inc.

(57) ABSTRACT

An exemplary camera module includes a barrel, a holder, and an image sensor assembly. The barrel forms an external thread on an outer surface thereof. At least one protrusion is formed along a circumferential direction on the outer surface thereof. The at least one protrusion and the external thread are arranged in an order written from an object side to an image side. An internal thread is formed on an inner wall of the holder to threadedly engage with the external thread of the barrel. The at least one protrusion contacts the inner wall of the holder but are slidable relative to the inner wall of the holder. The image sensor assembly includes an image sensor. The image sensor is received in the holder.

14 Claims, 3 Drawing Sheets

LENS MODULE WITH PROTRUSIONS ON OUTER SURFACE OF BARREL AND CAMERA MODULE HAVING SAME

BACKGROUND

1. Technical Field

The present disclosure relates to optical imaging and, particularly, to a lens module having protrusions on an outer surface of a barrel in order to contact a holder closely, and a camera module having the lens module.

2. Description of Related Art

With the ongoing development of optical imaging technology, camera modules are now widely used in a variety of electronic devices, such as mobile phones and personal digital assistants (PDAs).

A typical camera module includes a holder and a barrel. An image sensor is received in the holder, and at least one lens is received in the barrel. In general, the holder is usually threadedly engaged with the barrel. That is, an internal thread of the holder must match an external thread of the barrel in shape and thread pitch. Such structure requires high manufacturing precision using high precision mold, thus greatly increases cost. A relatively low precision mold is employed to reduce the production cost. However, thread produced by such low precision mold may result in a coaxial deviation between the lens and the image sensor after the barrel is assembled with the holder.

Therefore, a lens module and a camera module which can overcome the above mentioned problems are desired.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the views.

DETAILED DESCRIPTION

Various embodiments will now be described in detail below with reference to the drawings.

Figure 1:
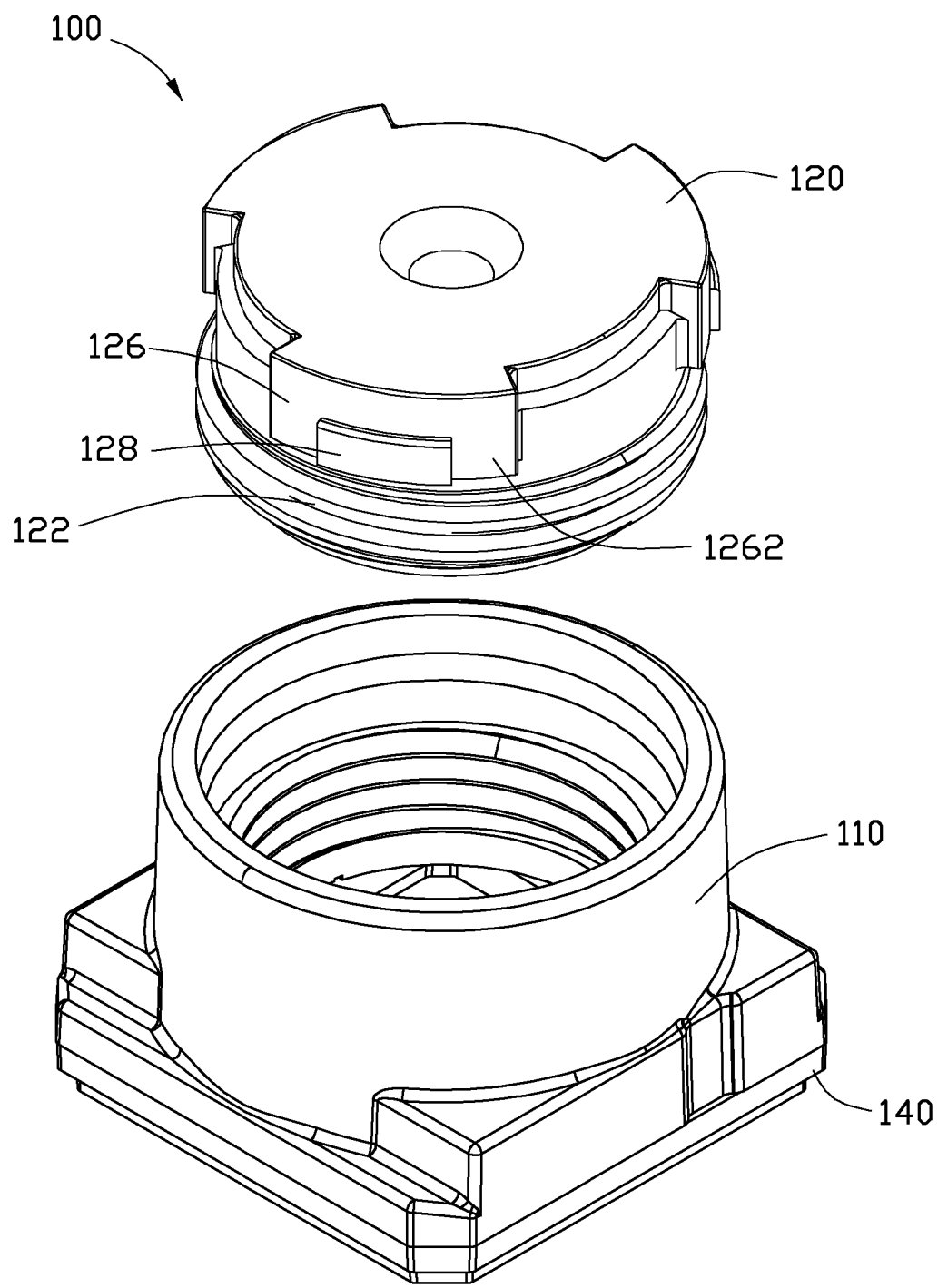
FIG. 1 is a schematic, partly exploded, isometric view of a camera module according to an exemplary embodiment of the present invention, the camera module including a lens module and an image sensor assembly.
Figure 2:
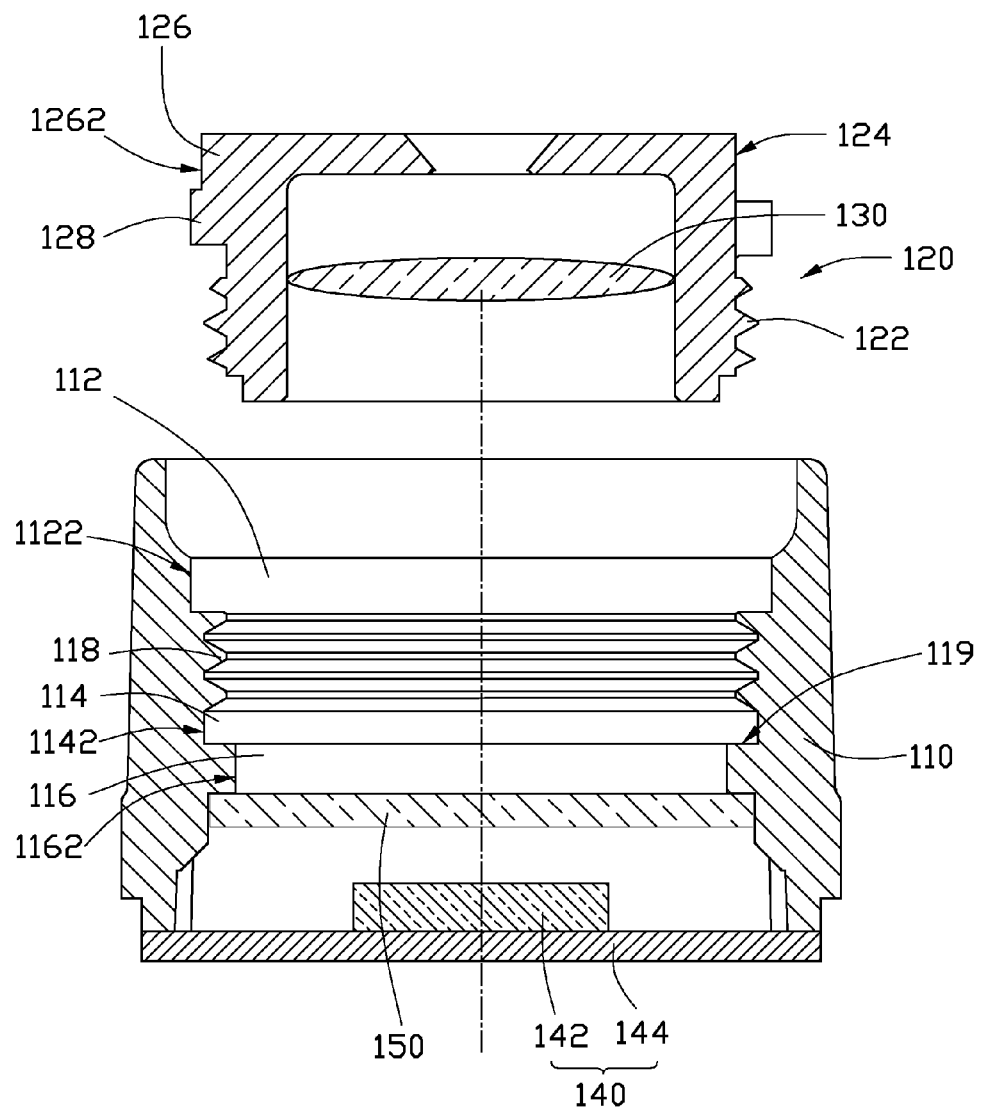
FIG. 2 is a schematic, partly exploded, sectional view of the camera module of FIG. 1.
Figure 3:
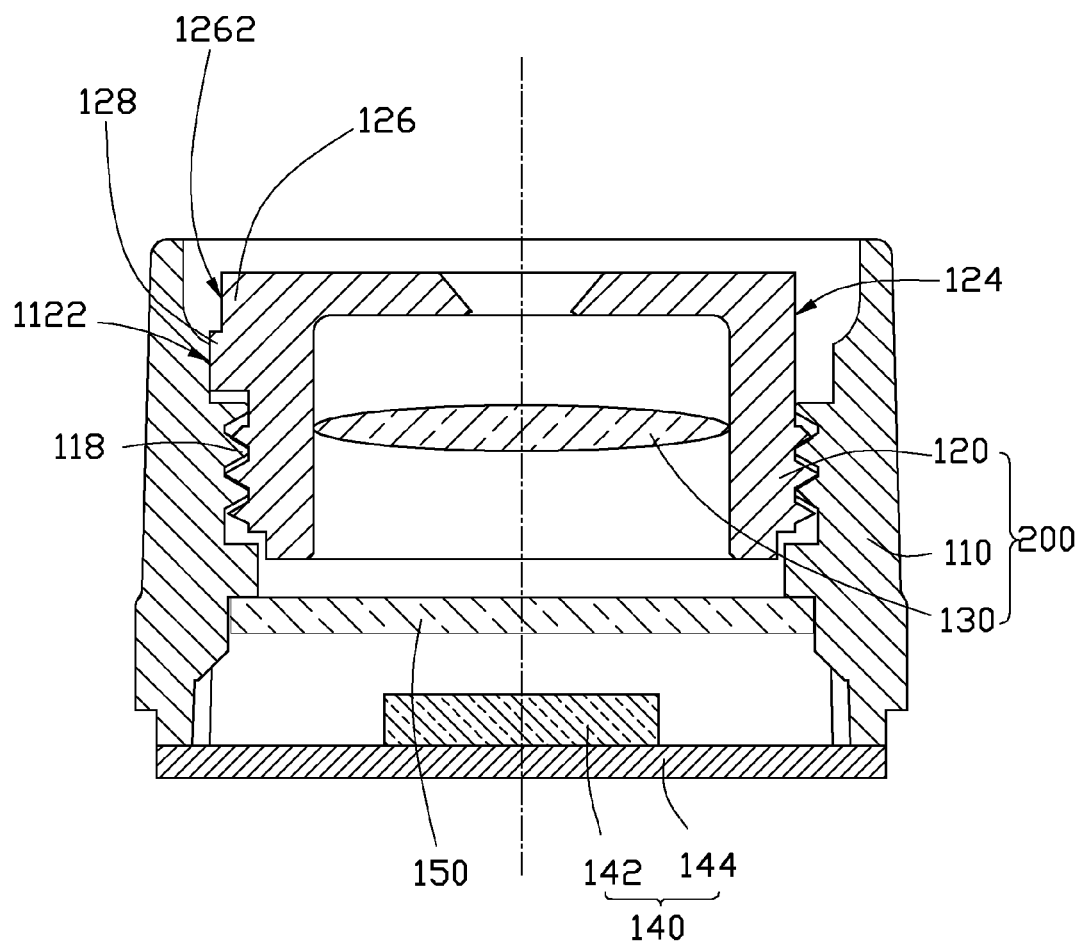
FIG. 3 is similar to FIG. 2, but showing the camera module fully assembled.

Referring to FIGS. 1-3, a camera module 100 includes a holder 110, a barrel 120, a lens 130 received in the barrel 120, an image sensor assembly 140, and a filter 150 received in the holder 110. The holder 110, the barrel 120, and the lens 130 cooperatively constitute a lens module 200.

The barrel 120 forms an external thread 122 on an outer cylindrical surface 124 near a bottom end thereof. Three first protrusions 126 are formed on the outer cylindrical surface 124 of the barrel 120. In the present embodiment, the three first protrusions 126 are formed on a top end of the barrel 120. The external thread 122 and the three first protrusions 126 are spaced by a distance. In the present embodiment, the three first protrusions 126 are equiangularly spaced from each other along a circumferential direction of the barrel 120.

Three second protrusions 128 are formed on a side surface 1262 of the three first protrusions 126, respectively. In the present embodiment, each second protrusion 128 is formed on a lower end of each first protrusion 126 and adjacent to the holder 110, and each second protrusion 128 is formed on a center of the side surface 1262 of each first protrusion 126. In the present embodiment, each first protrusion 126 is larger than each second protrusion 128. It can be understood that the number and the shape of the first protrusion 126 or the second protrusion 128 is not limited in the present embodiment. In the present embodiment, the sum of the radius of the barrel 120 plus the radial width of the first protrusion 126 plus the radial width of the second protrusion 128 is larger than an outer diameter of the external thread 122 of the barrel 120. In the present embodiment, the second protrusion 128 has a height relative to the outer cylindrical surface 124 greater than a maximum height of the external thread 122 relative to the outer cylindrical surface 124.

The holder 110 defines a first through hole 112, a second through hole 114, and a third through hole 116 arranged in an order written from an object side to an image side therein. The first through hole 112, the second through hole 114, and the third through hole 116 communicate with each other. In the present embodiment, the diameter of the first through hole 112, the second through hole 114, and the third through hole 116 gradually decreases. The first through hole 112, the second through hole 114, and the third through hole 116 include a first inner wall 1122, a second inner wall 1142, and a third inner wall 1162, respectively. The three second protrusions 128 all contact the first inner wall 1122 of the holder 110 but are rotatably slidable relative to the first inner wall 1122 of the holder 110. That is, the sum of the radius of the barrel 120 plus the radial width of the first protrusion 126 plus the radial width of the second protrusion 128 equals the radius of the first through hole 112. An internal thread 118 is formed on the second inner wall 1142 of the holder 110 to threadedly engage with the external thread 122 of the barrel 120. A substantially flat step surface 119 is formed between the second inner wall 1142 and the third inner wall 1162. The flat step surface 119 is configured to block the barrel 120 from moving forward in the holder 110.

The image sensor assembly 140 is mounted at an end of the holder 110, and includes an image sensor 142 and a printed circuit board 144. The printed circuit board 144 is mounted on an end face of the holder 110, with the image sensor 142 being received in the holder 110. The image sensor 142 is, for example, a charge coupled device (CCD) sensor or a complementary metal oxide semiconductor transistor (CMOS) sensor. It can be understood that in other embodiments, the camera module 100 can include more than one lens, or can include other optical elements, such as spacers.

It can be understood that in other embodiments, the camera module 100 can only have the three first protrusions 126. The three first protrusions 126 all contact the first inner wall 1122 of the holder 110 but are slidable relative to the first inner wall 1122 of the holder 110. That is, the sum of the radius of the barrel 120 plus the radial width of the first protrusion 126 equals the radius of the first through hole 114. In the present embodiment, the first protrusion 126 has a height relative to the outer cylindrical surface 124 greater than a maximum height of the external thread 122 relative to the outer cylindrical surface 124. In the present embodiment, the sum of the radius of the barrel 120 plus the radial width of the first protrusion 126 is larger than an outer diameter of the external thread 122 of the barrel 120. It can be understood that in other embodiments, only one first protrusion 126 surrounds the outer cylindrical surface 124 of the barrel 120.

When the barrel 120 is assembled in the holder 110, the external thread 122 of the barrel 120 engages with the internal thread 118 of the holder 110. At the same time, due to the three second protrusions 128 contacting the first inner wall 1122 of the holder 110, the coaxial precision of the lens 130 receive in the barrel 120 and the image sensor 142 received in the holder 110 can be improved when the barrel 120 is threadedly rotated into the holder 110. Furthermore, the contacting area between each second protrusion 128 and the first inner wall 1122 of the holder 110 is small, thus friction resulting from the rotation of the barrel 120 to the holder 110 can be reduced.

While certain embodiments have been described and exemplified above, various other embodiments from the foregoing disclosure will be apparent to those skilled in the art. The present invention is not limited to the particular embodiments described and exemplified but is capable of considerable variation and modification without departure from the scope and spirit of the appended claims.

The invention claimed is:

1. A lens module comprising:
   a barrel having an external thread formed on an outer cylindrical surface thereof, at least one protrusion formed on the outer cylindrical surface along a circumferential direction thereof, the at least one protrusion and the external thread arranged in an order written from an object side to an image side, wherein the at least one protrusion comprises a plurality of first protrusions and a plurality of second protrusions, and each second protrusion is formed on the respective first protrusion; and
   a holder, an internal thread formed on an inner wall of the holder to threadedly engage with the external thread of the barrel, the at least one protrusion contacting the inner wall of the holder but being slidable relative to the inner wall of the holder.

2. The lens module of claim 1, wherein the external thread and the at least one protrusion are spaced by a distance in an axis direction of the barrel.

3. The lens module of claim 1, wherein a height relative to the outer cylindrical surface of each of the second protrusions plus the radius of the barrel equals the radius of the first through hole.

4. The lens module of claim 1, wherein each of the second protrusions has a height relative to the outer cylindrical surface greater than a maximum height of the external thread relative to the outer cylindrical surface.

5. The lens module of claim 1, wherein each first protrusion is larger than each second protrusion.

6. The lens module of claim 1, wherein each second protrusion is formed on a lower end of each first protrusion adjacent to the holder.

7. The lens module of claim 1, wherein each second protrusion is formed on a center of a side surface of each first protrusion.

8. The lens module of claim 1, wherein the holder defines a first through hole, a second through hole, and a third through hole arranged in an order written from an object side to an image side therein, and the first through hole, the second through hole, and the third through hole comprise a first inner wall, a second inner wall, and a third inner wall thereof, respectively.

9. The lens module of claim 8, wherein the first through hole, the second through hole, and the third through hole communicate with each other.

10. The lens module of claim 8, wherein the second protrusions all contact the first inner wall of the holder but are slidable relative to the first inner wall of the holder.

11. The lens module of claim 8, wherein the internal thread is formed on the second inner wall of the holder.

12. The lens module of claim 8, wherein a flat step surface is formed between the second inner wall and the third inner wall, and the flat step surface is configured to block the barrel from moving forward in the holder.

13. A camera module comprising:
    a barrel having an external thread formed on an outer cylindrical surface thereof, at least one protrusions formed on the outer cylindrical surface along a circumferential direction thereof, the at least one protrusion and the external thread arranged in an order written from an object side to an image side, wherein the at least one protrusion comprises a plurality of first protrusions and a plurality of second protrusions, and each second protrusion is formed on the respective first protrusion;
    a holder, an internal thread formed on an inner wall thereof to threadedly engage with the external thread of the barrel, the at least one protrusion contacting the inner wall of the holder but being rotatably slidable relative to the inner wall of the holder; and
    an image sensor assembly comprising an image sensor, the image sensor received in the holder.

14. The camera module of claim 13, wherein the external thread and the at least one protrusion are spaced by a distance in an axis direction of the barrel.

\* \* \* \* \*